US008955730B2

(12) United States Patent
Nagao et al.

(10) Patent No.: US 8,955,730 B2
(45) Date of Patent: Feb. 17, 2015

(54) TAPE FEEDER AND METHOD OF MOUNTING TAPE ONTO TAPE FEEDER

(75) Inventors: Kazuhide Nagao, Fukuoka (JP); Nobuhiro Nakai, Yamanashi (JP); Yutaka Kinoshita, Yamanashi (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 13/820,642

(22) PCT Filed: Aug. 22, 2011

(86) PCT No.: PCT/JP2011/004651
§ 371 (c)(1),
(2), (4) Date: Mar. 4, 2013

(87) PCT Pub. No.: WO2012/049799
PCT Pub. Date: Apr. 19, 2012

(65) Prior Publication Data
US 2013/0153619 A1    Jun. 20, 2013

(30) Foreign Application Priority Data

Oct. 14, 2010    (JP) .................................. 2010-231240

(51) Int. Cl.
*B65H 5/28*    (2006.01)
*B32B 38/10*    (2006.01)
(Continued)

(52) U.S. Cl.
CPC ............ *H05K 13/02* (2013.01); *H05K 13/0084* (2013.01); *H05K 13/0417* (2013.01); *Y10S 156/93* (2013.01); *Y10S 156/941* (2013.01)
USPC ................ 226/6; 156/714; 156/764; 156/930; 156/941; 221/25; 221/79; 221/87; 226/59; 226/83; 226/86; 414/416.05

(58) Field of Classification Search
CPC ............ H05K 13/0084; H05K 13/021; H05K 13/0417
USPC ........ 156/714, 764, 930, 941; 221/25, 72, 73, 221/79, 87; 414/411, 412, 416.01, 416.03, 414/416.05, 416.08, 425, 811; 226/6, 59, 226/82, 83, 86, 89, 120, 128, 139
See application file for complete search history.

(56) References Cited

U.S. PATENT DOCUMENTS 4,657,158 A * 4/1987 Faes et al. ........................ 221/25
4,943,342 A * 7/1990 Golemon ....................... 156/750
(Continued)

FOREIGN PATENT DOCUMENTS

CN    1976559 A    6/2007
CN    101803491 A    8/2010
(Continued)

OTHER PUBLICATIONS

International Search Report for PCT/JP2011/0046501 dated Sep. 20, 2011.
(Continued)

*Primary Examiner* — Mark A Osele
(74) *Attorney, Agent, or Firm* — Pearne & Gordon LLP (57) ABSTRACT

A tape feeder includes a guide part that guides a carrier tape and is detachably attached to a main body. The guide part includes: a lower member guiding the carrier tape and attached to and detached from the main body; an upper member pressing down the carrier tape from above; a tape introduction part guiding the carrier tape into the upper member at an upstream side thereof in a tape feed direction; a confirmation opening part disposed in the upper member for visually confirming that the carrier tape arrives at a pin engagement range; an open/close mechanism opening and closing the upper member with respect to the lower member; and a positioning mechanism fitting a positioning pin into a feed hole of the carrier tape in the guide part, thereby positioning the carrier tape relative to the guide part in the tape feed direction.

5 Claims, 10 Drawing Sheets

(51) Int. Cl.
*H05K 13/02* (2006.01)
*H05K 13/00* (2006.01)
*H05K 13/04* (2006.01)

(56) References Cited

U.S. PATENT DOCUMENTS

| | | | |
|---|---|---|---|
| 6,402,452 | B1 | 6/2002 | Miller et al. |
| 8,715,459 | B2 * | 5/2014 | Nagao et al. ............... 156/714 |
| 2002/0014002 | A1 | 2/2002 | Bergstrom |
| 2005/0006030 | A1 | 1/2005 | Bergstrom |

FOREIGN PATENT DOCUMENTS

| | | |
|---|---|---|
| JP | 3-234098 A | 10/1991 |
| JP | 2007-150145 A | 6/2007 |
| JP | 4370058 B2 | 9/2009 |
| JP | 2010-165897 A | 7/2010 |

OTHER PUBLICATIONS

Chinese Office Action for Application No. 201180043436.3 dated Nov. 15, 2014.

* cited by examiner

TAPE FEEDER AND METHOD OF MOUNTING TAPE ONTO TAPE FEEDER

TECHNICAL FIELD

The present invention relates to a tape feeder that is mounted in a component mounting device and that supplies electronic components held on a carrier tape to a pickup position by a component transfer mechanism, a tape mounting method for mounting a carrier tape into the tape feeder in the tape feeder.

BACKGROUND ART

The tape feeder has been known as a supply device of the electronic components in the component mounting device. The tape feeder intermittently feeds the carrier tape holding the electronic components to supply the electronic components to the pickup position by a transfer head of a component mounting mechanism. In the vicinity of the pickup position, the carrier tape is fed pitch by pitch through a tape feed mechanism in a state where the carrier tape is guided along a tape travel path disposed within a main body of the tape feeder while an upper portion thereof is covered with a cover member. The electronic components are picked up at the pickup position by a transfer head of the component mounting mechanism through an opening portion for removal of the components, which is disposed in the cover member.

The carrier tape that holds the electronic components is generally supplied in a state where the carrier tape is winded on a supply reel. When a new carrier tape is mounted, a tap mounting work is conducted in which the carrier tape drawn from the supply reel is inserted from a tape mounting portion, put at the pickup position, and set on a lower surface side of the cover member. The tape mounting work requires a complicated operation that the carrier tape is pushed against the tape travel path from above by a retainer and set up in the main body, in a state where a feed hole of the carrier tape is correctly engaged with a feed pin of a sprocket configuring the tape feed mechanism.

For that reason, in order to facilitate the tape mounting work, there has been known that the taper feeder configured such that the tape guide that guides the carrier tape in the vicinity of the pickup position is detachably attached to the main body (for example, refer to Patent Document 1). According to this configuration, there is advantageous in that the carrier tape can be set up in the tape guide in a state where the tape guide is detached from the main body, and the workability of the tape mounting work can be improved.

RELATED ART DOCUMENTS

Patent Documents

Patent Document 1: JP-B-4370058

SUMMARY OF THE INVENTION

Problem to be Solved by the Invention

However, in the related art using a system for setting up the carrier tap in a state where the tape guide is detached from the main body such as the above-mentioned Patent Document, there is the following drawback in positioning the carrier tape. That is, there is a need to correctly engage the feed pin of the sprocket with the feed hole of the carrier tape as described above. However, in the related art, an operator visually confirms the position of the feed hole, and positions the carrier tape through a visual operation so that the position of the feed hole coincides with the position of the feed pin. The positioning must be conducted for the carrier tape already mounted on the tape guide. Therefore, there is a problem that a time is required for confirming the positioning in mounting the tape feeder into the main body, and time and effort are required for the carrier tape mounting work.

The present invention has an object to provide a tape feeder and a method of mounting a tape into the taper feeder, which can facilitate the positioning in the carrier tape mounting work, thereby improving the workability and the work efficiency.

Means for Solving the Problem

A tape feeder that feeds a carrier tape holding electronic components pitch by pitch to sequentially feed the electronic components a pickup position of a transfer head, the tape feeder including: a main body including a tape travel path for guiding the carrier tape; a tape feed mechanism that intermittently rotates a sprocket in a state in which a feed pin of the sprocket disposed in the main body engages a feed hole disposed in the carrier tape to feed the carrier tape at a given pitch; and a guide part that guides the carrier tape fed by the tape feed mechanism in a given range including the pickup position on the main body, and is detachably attached to the main body, wherein the guide part includes: a lower member that guides a lower surface side of the carrier tape and comprises an attachment/detachment mechanism that is attached to and detached from the main body; an upper member that is provided to include a pin engagement range where the feed pin of the sprocket engages the feed hole, guides a width direction of the carrier tape, and presses down the carrier tape from above to guide an upper surface thereof; a tape introduction part that is disposed at an upstream side of the upper member in a tape feed direction, and guides the carrier tape into the upper member; a confirmation opening part disposed in the upper member for visually confirming that the introduced carrier tape arrives at the pin engagement range; an open/close mechanism that opens and closes the upper member with respect to the lower member; and a positioning mechanism that fits a positioning pin into the feed hole of the carrier tape in the guide part, thereby positioning a relative position of the carrier tape and the guide part in the tape feed direction.

A tape mounting method of mounting a carrier tape into a tape feeder that feeds the carrier tape pitch by pitch to sequentially feed electronic components to a pickup position of a transfer head and includes: a main body including a tape travel path for guiding the carrier tape holding the electronic components; a tape feed mechanism that intermittently rotates a sprocket in a state in which a feed pin of the sprocket disposed in the main body engages a feed hole disposed in the carrier tape to feed the carrier tape at a given pitch; and a guide part that guides the carrier tape fed by the tape feed mechanism in a given range including the pickup position on the main body, and is detachably attached to the main body, wherein the guide part includes: a lower member that guides a lower surface side of the carrier tape and comprises an attachment/detachment mechanism that is attached to and detached from the main body; an upper member that guides a width direction of the carrier tape, and presses down the carrier tape from above to guide an upper surface thereof; a tape introduction part that is disposed at an upstream side of the upper member in a tape feed direction, and guides the carrier tape into the upper member; a confirmation opening part disposed in the upper member for visually confirming that the introduced carrier tape arrives at the pin engagement range; an open/close mechanism that opens and closes the upper member with respect to the lower member; and a positioning mechanism that fits a positioning pin into the feed hole of the carrier tape in the guide part, thereby positioning a relative position of the carrier tape and the guide part in the tape feed direction, the tape mounting method including: a tape introducing step of introducing the carrier tape into the upper member from the tape introduction part in a state in which the guide part is detached from the main body; a tape confirming step of visually confirming that the introduced carrier tape arrives at the pin engagement range; a positioning step of adjusting the relative position of the carrier tape and the guide part in the tape feed direction by fitting the positioning pin into the feed hole of the introduced carrier tape; and a guide part fixing step of fixedly mounting the guide part on the main body after the positioning step.

Advantages of the Invention

According to the present invention, the guide part, which guides the carrier tape fed by the tape feed mechanism in a given range including the pickup position and is detachably attached to the main body, includes: the lower member that guides the lower surface side of the carrier tape and comprises the attachment/detachment mechanism that is attached to and detached from the main body; the upper member that guides the width direction of the carrier tape, and presses down the carrier tape from above to guide the upper surface thereof; the tape introduction part that is disposed at the upstream side of the upper member in the tape feed direction, and guides the carrier tape into the upper member; a confirmation opening part disposed in the upper member for visually confirming that the introduced carrier tape arrives at the pin engagement range; the open/close mechanism that opens and closes the upper member with respect to the lower member; and the positioning mechanism that fits the positioning pin into the feed hole of the carrier tape in the guide part, thereby positioning the relative position of the carrier tape and the guide part in the tape feed direction. Consequently, the positioning in the carrier tape mounting work can be facilitated, and the workability and the work efficiency are improved.

MODE FOR CARRYING OUT THE INVENTION

Subsequently, an embodiment of the present invention will be described with reference to the drawings. First, a configuration of a component mounting device 1 that mounts electronic components on a substrate will be described with reference to FIGS. 1 and 2. The component mounting device 1 has a function of mounting the electronic components such as semiconductor chips on the substrate, and FIG. 2 partially illustrates a cross section A-A in FIG. 1.

Figure 1:
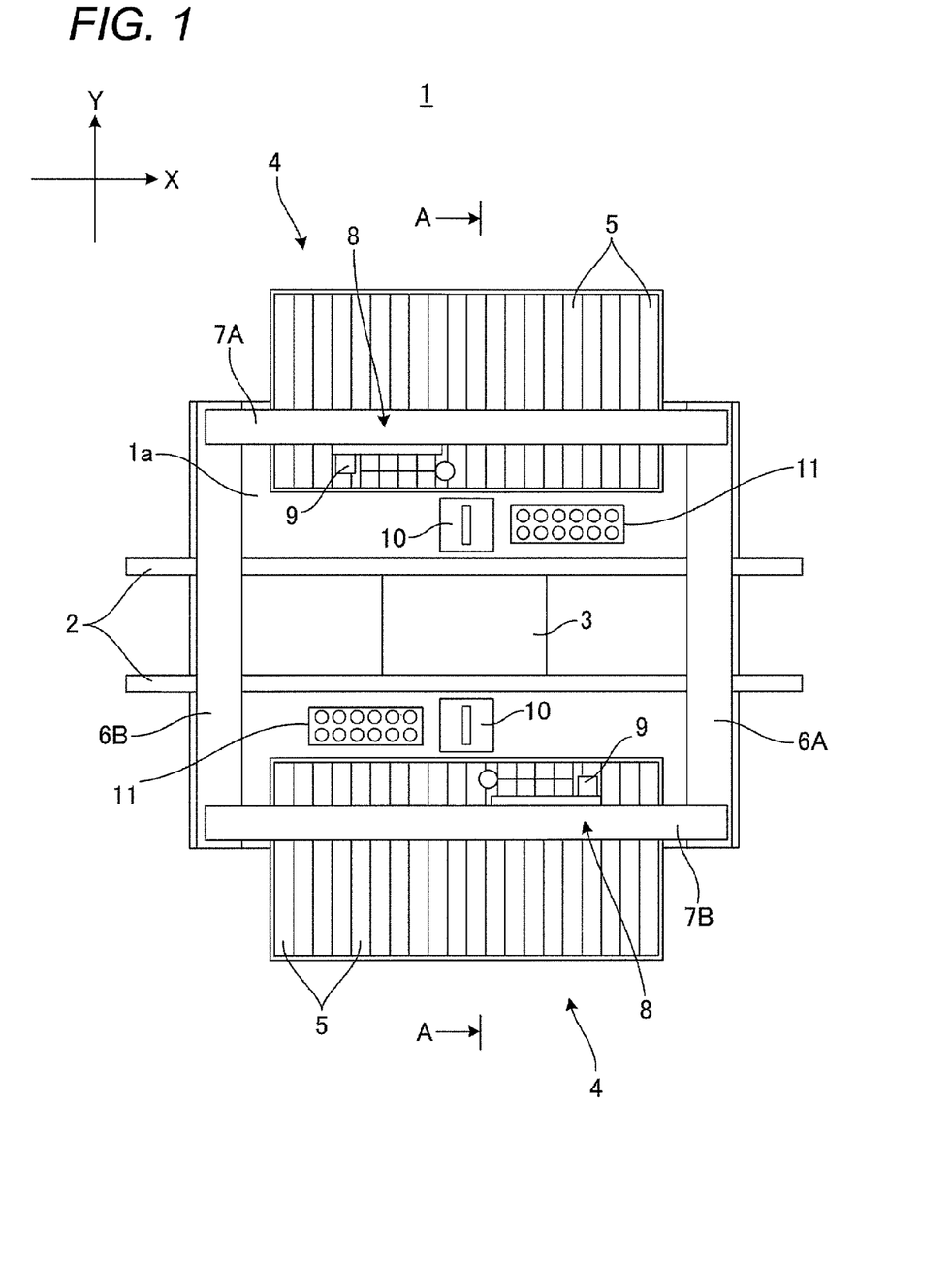
FIG. 1 is a plan view illustrating a component mounting device according to an embodiment of the present invention.

Referring to FIG. 1, a substrate transport mechanism 2 is arranged in the center of a base 1a in an X-direction (substrate transport direction). The substrate transport mechanism 2 transports a substrate 3 brought in from an upstream side, and positions the substrate 3 on a mounting stage set for execution of a component mounting work. Component supply parts 4 are arranged on both sides of the substrate transport mechanism 2, and plural tape feeders 5 is arranged in parallel in each of the component supply parts 4. The tape feeders 5 feed the carrier tape holding the electronic components pitch by pitch, to thereby supply the electronic components to a pickup position where pickup is conducted by an adsorption nozzle of a transfer head which will be described below.

Y-axial tables 6A and 6B are arranged on an upper surface of the base 1a on both ends thereof, and two X-axial tables 7A and 7B are extended on and between the Y-axial tables 6A and 6B. The X-axial table 7A horizontally travels in a Y-direction by driving the Y-axial table 6A, and the X-axial table 7B horizontally travels in the Y-direction by driving the Y-axial table 6B. Each of the X-axial tables 7A and 7B is equipped with a transfer head 8 and a substrate recognition camera 9 that travels integrally with the transfer head 8.

The Y-axial table 6A, the X-axial table 7A, the Y-axial table 6B, and the X-axial table 7B are each driven in combination whereby the transfer head 8 travels horizontally. The electronic components are picked up from the respective component supply parts 4 by an adsorption nozzle 8a (refer to FIG. 2), and mounted on the substrate 3 positioned by the substrate transport mechanism 2. The Y-axial table 6A, the X-axial table 7A, the Y-axial table 6B, and the X-axial table 7B configure a head travel mechanism that moves the transfer head 8.

The substrate recognition camera 9 that travels onto the substrate 3 together with the transfer head 8 images and recognizes the substrate 3. A component recognition camera 10 is arranged in a route extending from the component supply parts 4 to the substrate transport mechanism 2. When the transfer head 8 that has extracted the electronic components from the component supply parts 4 travels to the substrate 3 positioned on the mounting stage, the transfer head 8 moves each electronic component held by the adsorption nozzle 8a in the X-direction above the component recognition camera 10. As a result, the component recognition camera 10 images the electronic components held by the adsorption nozzle 8a. Then, the imaging result is subjected to recognition processing by a recognition device (not shown), to thereby recognize a position of the electronic components held by the adsorption nozzle 8a, and also discriminate the type of electronic components. A nozzle holding part 11 stores plural types of adsorption nozzles 8a in a given posture, and the transfer head 8 accesses to the nozzle holding part 11 and conducts nozzle exchange operation, thereby executing the nozzle exchange according to the type of subject electronic component in the transfer head 8.

Figure 2:
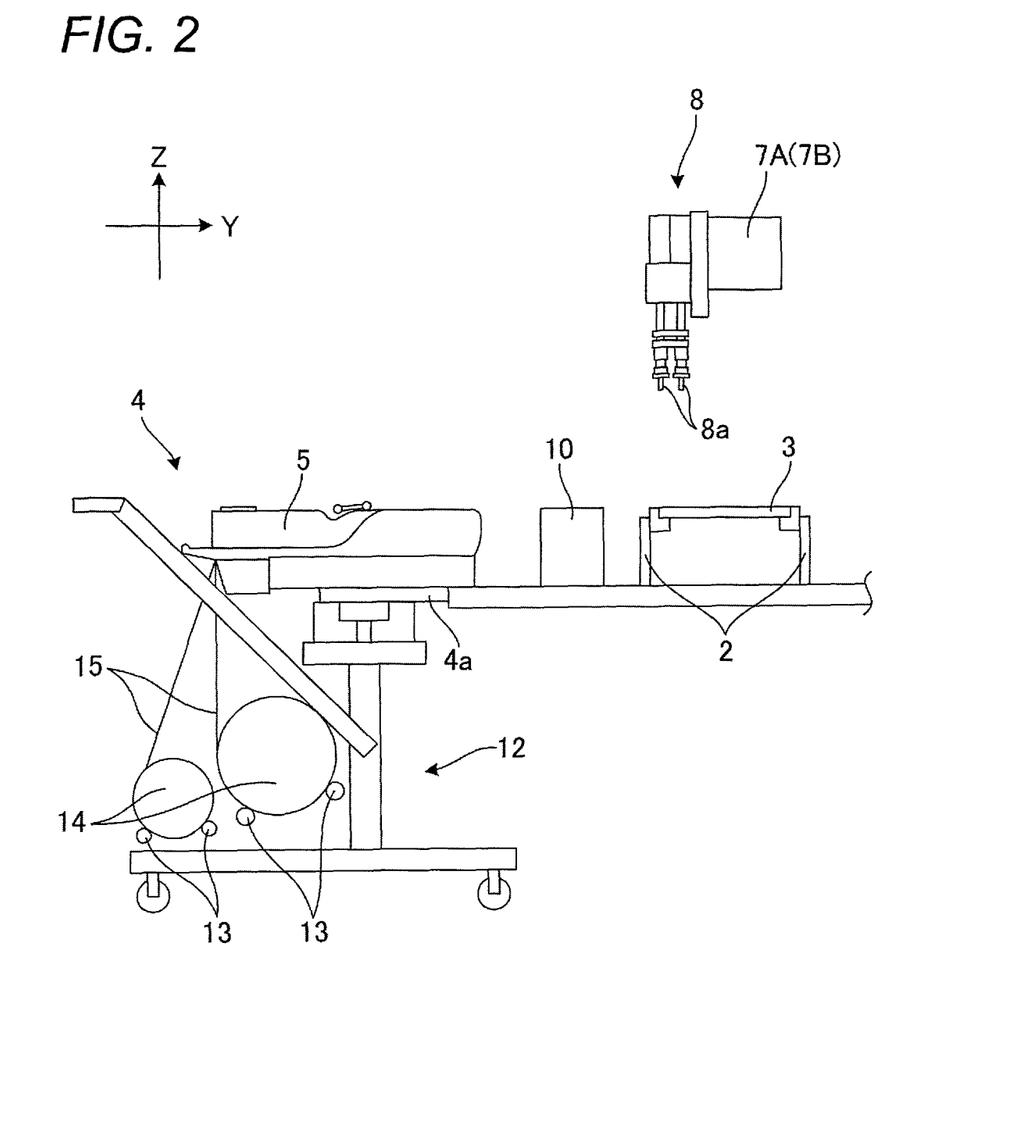
FIG. 2 is a partially cross-sectional view illustrating the component mounting device according to the embodiment of the present invention.

A structure of the component supply parts 4 will be described. As illustrated in FIG. 2, the component supply parts 4 are each equipped with a feeder base 4a for equipping the plural tape feeders 5. The tape feeders 5 are arranged in the component supply parts 4 by a carriage 12 for equipping the feeders, and the carriage 12 is equipped with reel holding parts 13 for holding tape reels 14 that each stores carrier tape 15 in a winded state. The reel holding parts 13 is equipped with holding rollers for rotatably holding the tape reels 14, and the tape reels 14 arranged in the component supply parts 4 are rotated so that the carrier tape 15 can be drawn from each of the tape reels 14.

Figure 3:
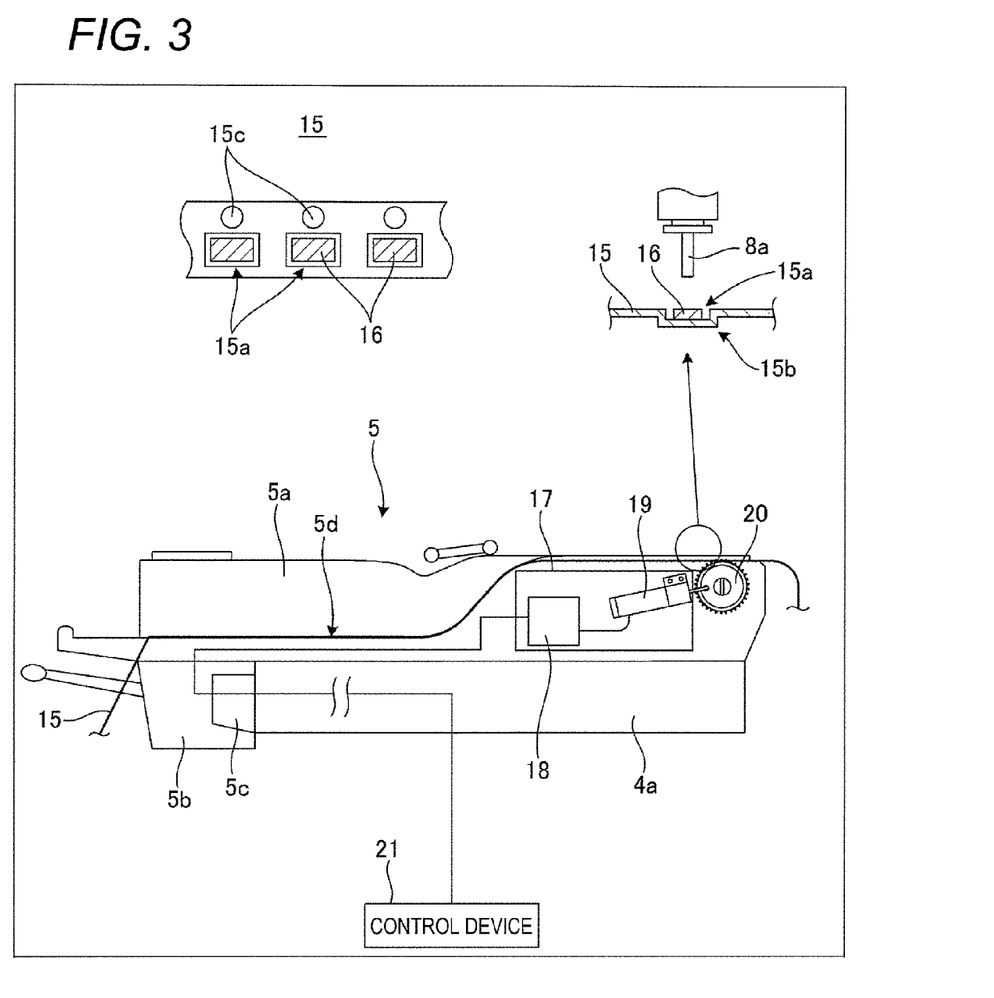
FIG. 3 is an illustrative view illustrating a configuration of a tape feeder according to the embodiment of the present invention.

Subsequently, a configuration and a function of the tape feeders 5 will be described with reference to FIG. 3. As illustrated in FIG. 3, the tape feeders 5 includes a feeder main body 5a and a mounting part 5b protruded downward from a lower surface of the feeder main body 5a. In a state where each of the tape feeders 5 is placed on the lower surface of the feeder main body 5a along a feeder base 4a, a connector part 5c disposed in the mounting part 5b is fitted to the feeder base 4a. As a result, the tape feeders 5 are fixed to the component supply parts 4, and the tape feeders 5 are electrically connected to a control device 21 of the component mounting device 1.

A tape travel path 5d that guides the carrier tape 15 drawn from the tape reels 14 and taken within the feeder main body 5a is continuously extended from a rear end of the feeder main body 5a to a tip thereof. In the carrier tape 15, component pockets 15a that each store and hold an electronic component 16, and feed holes 15c for feeding the carrier tape 15 pitch by pitch are disposed at given pitches. An emboss part 15b protruded downward from each lower surface side of the component pockets 15a. A tape feeder 17 for feeding the carrier tape 15 pitch by pitch is equipped within the main body 5a. The tape feeder 17 includes a feed motor 19 that rotationally drives a sprocket 20 disposed in the tip of the tape travel path 5d and a feeder controller 18 that controls the feed motor 19. In a state where each of the tape feeders 5 is mounted on the feeder base 4a, the feeder controller 18 connects to the control device 21.

In the sprocket 20, feed pins 20a (refer to FIG. 8) that are fitted into the feed holes 15c are disposed at given pitches, and in a state where those feed pins are fitted into the feed holes 15c, the feed motor 19 is driven to intermittently rotate the sprocket 20 through a bevel gear 25 coupled with a rotating shaft 19a. As a result, the carrier tape 15 is fed downstream (right in FIG. 3) pitch by pitch. The sprocket 20 and the feed motor 19 configure a tape feed mechanism that feeds the carrier tape 15 at a given pitch by intermittently rotating the sprocket 20 in a state where the feed pins 20a of the sprocket 20 disposed in the main body 5a is engaged with the feed holes 15c.

A near side of the sprocket 20 configures a pickup position that adsorbs and extracts the electronic component 16 within each of the component pockets 15a by the adsorption nozzle 8a of the transfer head 8. The carrier tape 15 fed along the tape travel path 5d by the above-mentioned tape feed mechanism is guided in a given range including the pickup position on the main body 5a, that is, in a range required in order that the carrier tape 15 is guided to the pickup position by the adsorption nozzle 8a and the feed holes 15c are correctly engaged with the feed pins 20a, by a guide part 30 that will be described below.

Figure 4:
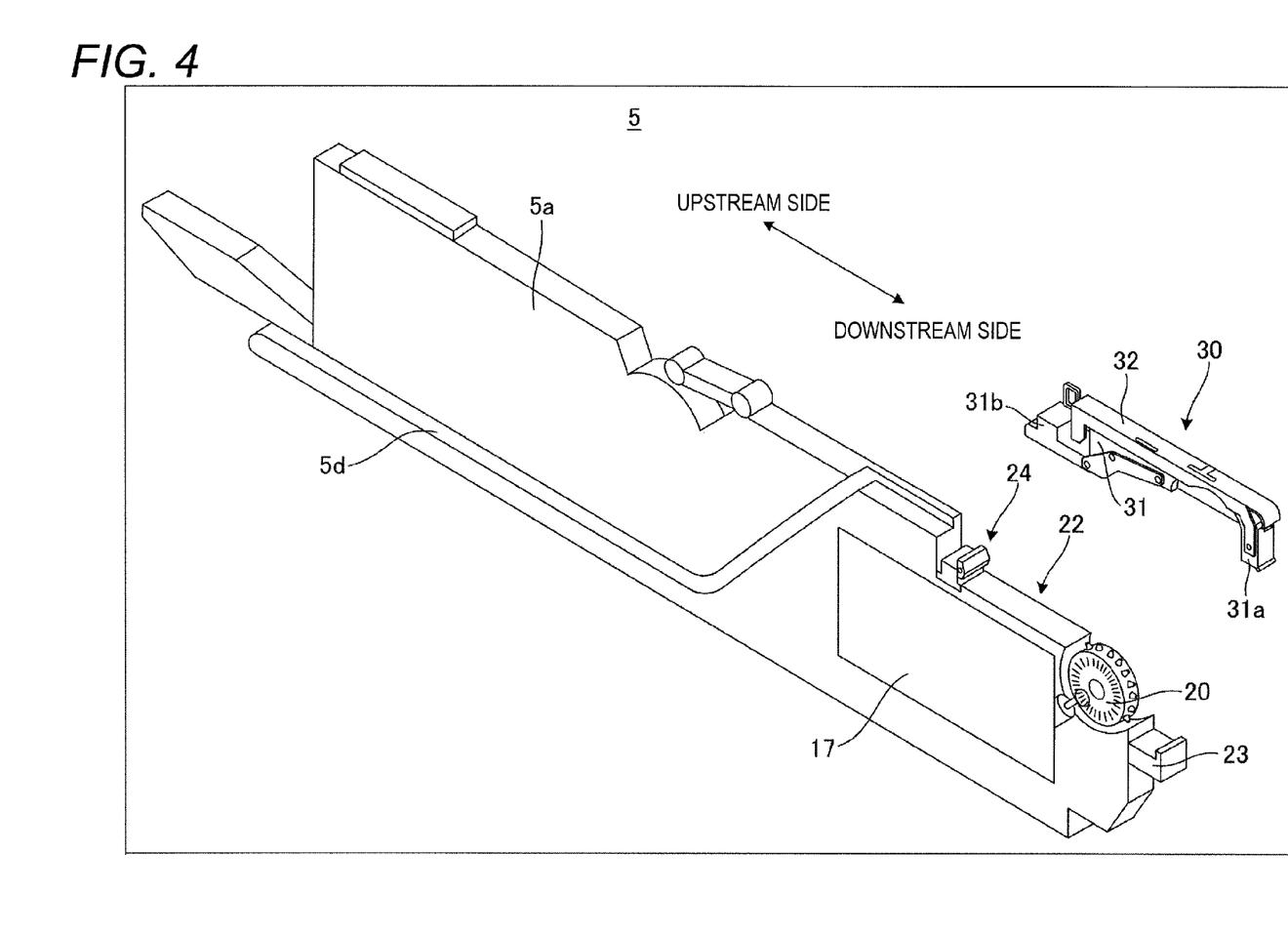
FIG. 4 is a perspective view illustrating the tape feeder according to the embodiment of the present invention.

As illustrated in FIG. 4, in a given range of the tip (downstream in a tape feed direction) of the main body 5a, there is formed a guide mounting portion 22 to which the guide part 30 is detachably attached. The guide part 30 is configured by a lower member 31 and an upper member 32. A downstream mounting part 31a and an upstream mounting part 31b which are disposed in the lower member 31 are fixedly engaged with a downstream fitting part 23 and an upstream fitting part 24, respectively. As a result, the guide part 30 is mounted on the guide mounting portion 22, and reverse operation is conducted to detach the guide part 30 from the guide mounting portion 22.

Figure 5:
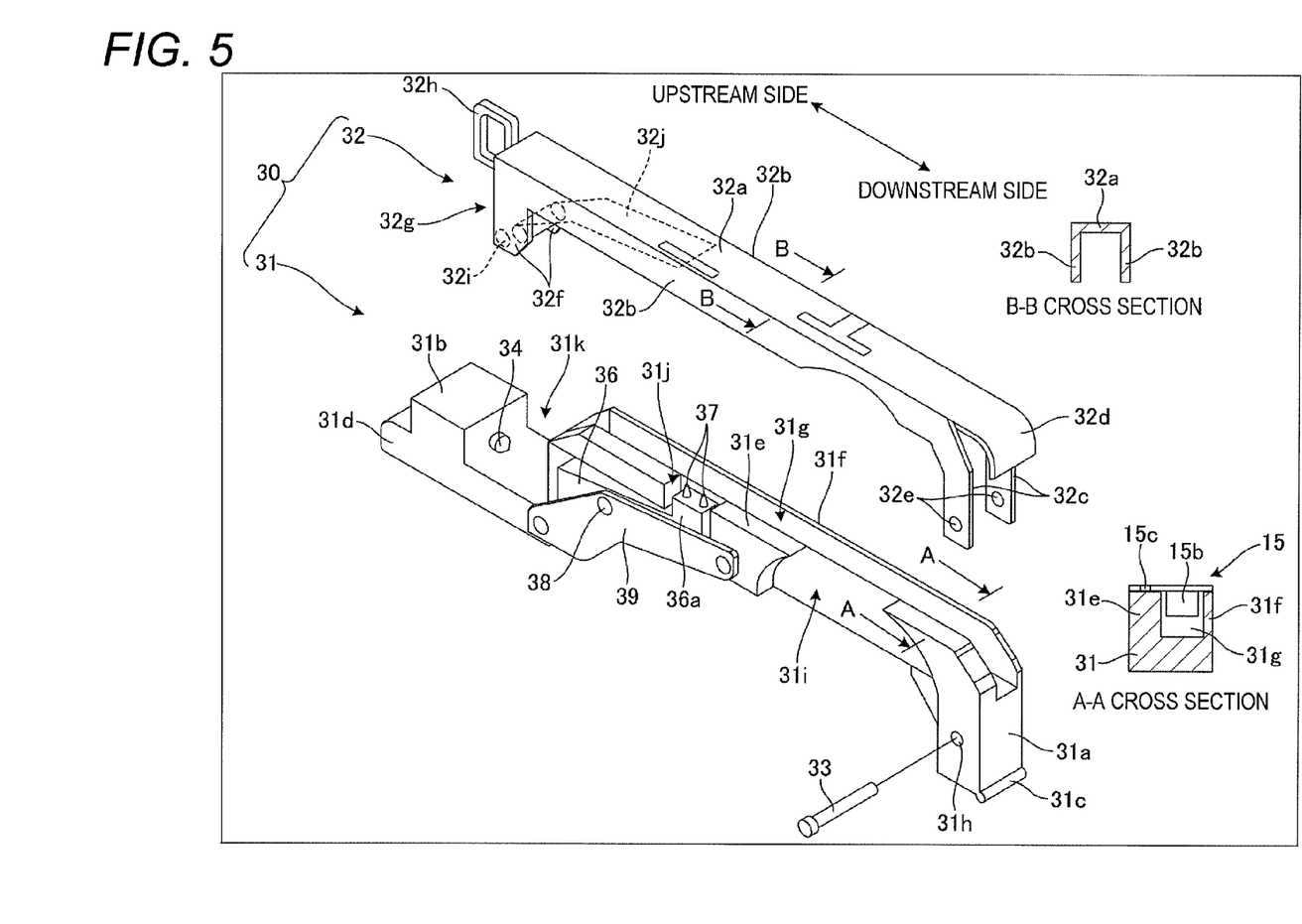
FIG. 5 is an illustrative view illustrating a configuration of a guide part equipped in the tape feeder according to the embodiment of the present invention.

Hereinafter, the respective parts configuring the guide part 30 and the functions of those respective parts will be described with reference to FIGS. 5 to 8. As illustrated in FIG. 5, the guide part 30 is configured by the lower member 31 and the upper member 32. The lower member 31 is configured so that a groove portion 31g is formed in an upper surface of a longitudinal member having a rectangular cross section configuring a main body of the lower member 31 as illustrated in a cross section A-A. The lower member 31 has a function of supporting the carrier tape 15 from a lower surface side thereof by tape support parts 31e and 31f on both sides of the groove portion 31g. In a state where the carrier tape 15 is placed on the lower member 31, the emboss part 15b is fitted into the groove portion 31g. A range in which the feed holes 15c are formed is supported by the tape support part 31e, and an end on an opposite side thereof is supported by the tape support part 31f to guide tape feed. Likewise, in the case of a planar paper tape having no emboss part 15b, the carrier tape 15 is supported by the tape support parts 31e and 31f.

The downstream mounting part 31a extends downward from a tip of the lower member 31 at a downstream side thereof (right in FIG. 5), and a fitting part 31c is disposed on a lower end of the downstream mounting part 31a so as to be fitted into a fitting recess 23a (refer to FIG. 8) of the downstream fitting part 23. The upstream mounting part 31b extends upstream (left in FIG. 5) of the lower member 31. An engaged part 31d is disposed on a tip of the lower member 31 so as to be engaged with an engaging member 24a of the upstream fitting part 24. In mounting the guide part 30 on the guide mounting portion 22 of each tape feeder 5, the engaged part 31d is engaged with the engaging member 24a in a state where the fitting part 31c is fitted into the fitting recess 23a of the downstream fitting part 23.

Also, when the guide part 30 is detached from the guide mounting portion 22 of each tape feeder 5, the fitting part 31c is detached from the fitting recess 23a in a state where an engagement of the engaged part 31d with the engaging member 24a is released. Accordingly, the fitting part 31c and the engaged part 31d disposed in the lower member 31 configure an attachment/detachment mechanism that attaches/detaches the lower member 31 to/from the main body 5a. That is, in a configuration of the guide part 30 according to this embodiment, the lower member 31 has a function of guiding the lower surface side of the carrier tape 15, and is also provided with the attachment/detachment mechanism that is detachably attached to the main body 5a.

A shape of the upper member 32 will be described. As illustrated in a cross section B-B of FIG. 5, the upper member 32 mainly includes a longitudinal member having a rectangular frame-shaped cross section opened downward, that is, a cross-sectional shape in which side parts 32b extend downward from both sides of a horizontal upper surface 32a. A tip of the upper member 32 at a downstream side thereof is provided with pivotally support plates 32c extending downward from side parts 32b, and an upper cover part 32d curved downward from the upper surface 32a and covering an upper side of the pivotally support plates 32c. The pivotally support plates 32c are each provided with a shaft hole 32e. When the upper member 32 is coupled with the lower member 31, a pivotally support pin 33 that is fitted into a pivotally shaft hole 31h formed in the downstream mounting part 31a is inserted through the shaft hole 32e, and the upper member 32 is pivotally supported by the pivotally support pin 33. As a result, the upper member 32 is openably coupled to the lower member 31.

That is, the pivotally shaft hole 31h formed in the downstream mounting part 31a, the shaft hole 32e formed in the pivotally support plates 32c, and the pivotally support pin 33 configure an open/close mechanism that opens and closes the upper member 32 with respect to the lower member 31. That is, the open/close mechanism opens and closes the upper member 32 with respect to the lower member 31 by rotating the upper member 32 about a pivotally support point (pivotally support pin 33 fitted into pivotally shaft hole 31h) disposed downstream of the lower member 31 in the tape feed direction.

Figures 6A, 6B, 6C:
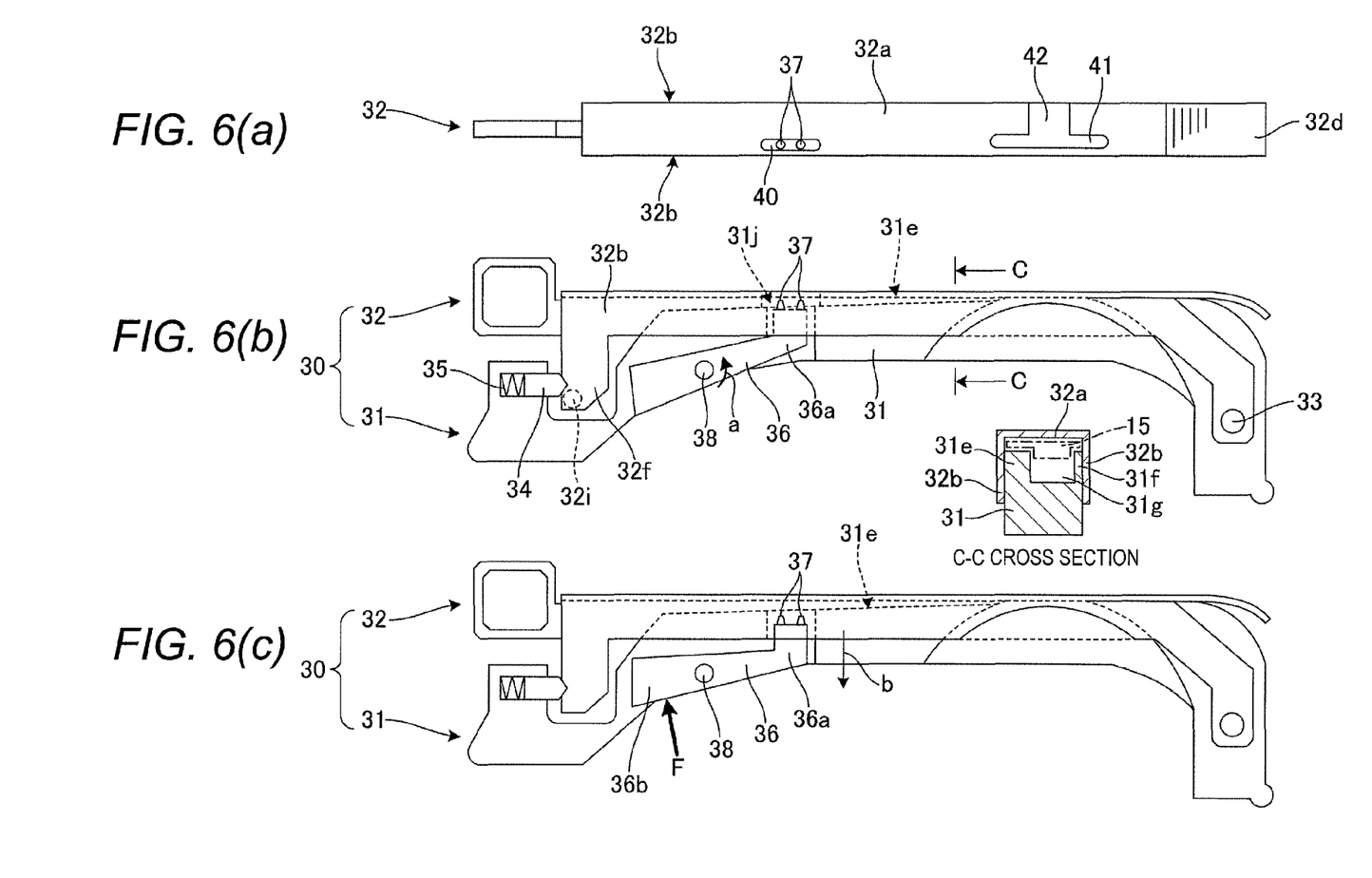
FIGS. 6(a) to 6(c) are illustrative views illustrating a function of the guide part equipped in the tape feeder according to the embodiment of the present invention.

In a state where the upper member 32 is closed with respect to the lower member 31, that is, in a state (refer to FIG. 6(b)) in which the upper member 32 is rotated about the pivotally support pin 33 to cover the upper side of the lower member 31, the side parts 32b of the upper member 32 are located on side surfaces of the tape support parts 31e and 31f, and guide a width direction of the carrier tape 15. Also, the upper surface 32a is located on an upper surface of the carrier tape 15 fed on the lower member 31, and presses the carrier tape 15 from the upper side, and guides the upper surface thereof (refer to a cross section C-C in FIG. 6(b)). That is, the upper member 32 has functions of guiding the width direction of the carrier tape 15, and also pressing the carrier tape 15 from the upper side to guide the upper surface thereof.

Upstream of the upper member 32, bend parts 32f are bent downward and extended from the side parts 32b, and a space between the two bend parts 32f forms a tape push-in port 32g opened upward and provided to guide the carrier tape 15 thereinto. When the carrier tape 15 is set up in the guide part 30, a tip 15e (refer to FIG. 9(a)) of the carrier tape 15 is inserted from the tape push-in port 32g, and guided downstream within the upper member 32 while guiding the carrier tape 15 by an introduction member 32j disposed inside of the upper member 32. That is, the tape push-in port 32g configures a tape introduction part that is disposed at an upstream side of the upper member 32 in the tape feed direction, and guides the carrier tape 15 into the upper member 32.

A locking pin 32i for engagement is disposed on a lower end of the bend parts 32f. In the state where the upper member 32 is closed with respect to the upper member 32, the bend parts 32f are fitted into an engagement recess 31k disposed downstream of the upstream mounting part 31b. A pin-shaped engagement member 34, which is urged downstream in a horizontal direction by a compression spring 35, is equipped in the upstream mounting part 31b so as to be protruded into the engagement recess 31k. In the state where the upper member 32 is closed with respect to the lower member 31, the engagement member 34 is engaged with the locking pin 32i to fix a position of the upper member 32. An end of the upper member 32 at the upstream side is provided with a grip ring 32h, and during the operation of opening and closing the upper member 32, the operator grips and presses down the grip ring 32h, and conducts pull-up operation.

A range of the tape support part 31e, which interferes with the sprocket 20 in a mounting state on the main body 5a, is provided with an escape part 31i according to a shape of the sprocket 20. Further, the tape support part 31e is provided with a notch part 31j for allowing a positioning mechanism, which will be described below, to be incorporated thereinto. The notch part 31j is provided in a range where a part of an upper surface of the tape support part 31e is partially notched, and the positioning member 36 having a pin attachment part 36a bent upward from one end of a slender member is accommodated. The positioning member 36 is pivotally supported to the lower member 31 by a pivotally support pin 38, and one side of the pivotally support pin 38 is supported by a support bracket 39 fixed to a side surface of the tape support part 31e. In the drawings other than FIG. 5, the support bracket 39 is omitted. A pair of positioning pins 37 is disposed on an upper surface of the pin attachment part 36a at distances corresponding to a pitch of the feed holes 15c in the carrier tape 15, and the positioning pins 37 can be exposed from an upper surface of the tape support part 31e through the notch part 31j.

Subsequently, a description will be given of a configuration of the guide part 30 and functions of the respective parts in a state where the upper member 32 is closed with respect to the lower member 31 with reference to FIGS. 6(a) to 6(c), and 7. FIG. 6(a) illustrates a plan view of the upper member 32, and the upper surface 32a is formed with a first opening part 40, a second opening part 41, and a third opening part 42. The first opening part 40 is an opening part intended to prevent an interference with the upper surface 32a at an opening position of the notch part 31j in the lower member 31, that is, in a state where the positioning pins 37 disposed in the pin attachment part 36a are protruded upward, and also to visually confirm the position of the positioning pins 37 from above.

The second opening part 41 is intended to prevent an interference between the feed pins 20a of the sprocket 20 and the upper surface 32a in a state where the guide part 30 is set up in the main body 5a. Further, the third opening part 42 is an opening for allowing the electronic component 16 held by the carrier tape 15 to be picked up by the adsorption nozzle 8a, and provided at a position that coincides with a position at which the component pockets 15a intermittently stops. As described above, in this embodiment, when the carrier tape 15 is set up, the tip 15e of the carrier tape 15 is inserted into the upper member 32 from the tape push-in port 32g disposed upstream of the upper member 32. In this situation, the upper member 32 has a cross-sectional shape in which the upper member 32 is opened downward, and an upper surface thereof is closed. Therefore, it cannot be easily confirmed from the external where the tip 15e is inserted into.

For that reason, in this embodiment, when the carrier tape 15 is set up in the upper member 32, the interior is visually recognized through the second opening part 41 to confirm that the tip 15e of the carrier tape 15 reaches a pin engagement range with the feed pins 20a of the sprocket 20. That is, in this embodiment, the second opening part 41 functions as a confirmation opening part disposed in the upper member 32 for visually confirming that the introduced carrier tape 15 arrives at the pin engagement range. It is needless to say that the confirmation opening part having this function may be disposed separately from the second opening part 41.

FIG. 6(b) illustrates a state in which the upper member 32 is rotated about the pivotally support pin 33, and closed with respect to the lower member 31. In this situation, the locking pin 32i disposed in the bend parts 32f is engaged with the engagement member 34 to fix the upper member 32. In this situation, the positioning member 36 is urged about the pivotally support pin 38 counterclockwise (arrow a) by urging means (not shown), and the positioning pins 37 are protruded from the upper surface of the tape support part 31e through the notch part 31j.

With the above configuration, in a state where the guide part 30 is detached from the main body 5a, the positioning pins 37 that are always located at the fixing positions are fitted into the feed holes 15c of the carrier tape 15 guided into the upper member 32 and sandwiched between the upper member 32 and the lower member 31 to determine a relative position between the guide part 30 and the carrier tape 15 in the tape feed direction. In this positioning state, the positions of the positioning pins 37 are set to positions at which the feed holes 15c of the carrier tape 15 are correctly engaged with the feed pins 20a of the sprocket 20. Accordingly, the guide part 30 in a state where the carrier tape 15 is positioned by the positioning pins 37 is fixedly mounted on the guide mounting portion 22, as a result of which the carrier tape 15 is set at the positions where the feed pins 20a of the sprocket 20 are engaged with the feed holes 15c without requiring another position adjusting operation.

FIG. 6(c) illustrates a state in which an external force F for fitting disengagement is exerted on an end 36b on an opposite side of the pin attachment part 36a from the bottom in the state illustrated in FIG. 6(b). That is, the external force F allows the positioning member 36 to rotate about the pivotally support pin 38 clockwise against the urging force, and the pin attachment part 36a comes down together with the positioning pins 37 (arrow b), and retreats from the upper surface of the shaft hole 32e. In this embodiment, in the guide mounting portion 22 of the main body 5a, a leaf spring member 26 (refer to FIG. 8) is arranged at a position corresponding to the opposite end 36b. As a result, in a state where the guide part 30 is mounted on the guide mounting portion 22 of the main body 5a, the leaf spring member 26 exerts an upward external force on the positioning member 36 (refer to FIG. 6(c)), and the positioning pins 37 are detached from the feed holes 15c of the carrier tape 15. Accordingly, the pitch feed of the carrier tape 15 is not prevented by the positioning pins 37.

In the above configuration, the positioning member 36 pivotally positioned by the pivotally support pin 38 and the positioning pins 37 disposed in the pin attachment part 36a configure a positioning mechanism for positioning a relative position between the carrier tape 15 and the guide part 30 in the tape feed direction by fitting the positioning pins 37 into the feed holes 15c of the carrier tape 15 in the guide part 30. In this embodiment, the positioning mechanism is configured by disposing the positioning pins 37 in the lower member 31, and includes a fitting detaching mechanism which detaches the positioning pins 37 from the feed holes 15c in a state in which the lower member 31 is mounted on the guide mounting portion 22 of the main body 5a.

This embodiment illustrates a configuration example in which the leaf spring member 26 exerts a rotating force on the positioning member 36 as the fitting detaching mechanism. However, the fitting detaching mechanism may use another mechanism such as a compression spring if the positioning member 36 operates so as to allow the pin attachment part 36a to come down. Also, this embodiment illustrates a configuration example in which the positioning mechanism is disposed in the lower member 31. However, the positioning mechanism may be disposed in the upper member 32 if the positioning mechanism has a function of positioning the relative position of the carrier tape 15 and the guide part 30 in the tape feed direction.

Figure 7:
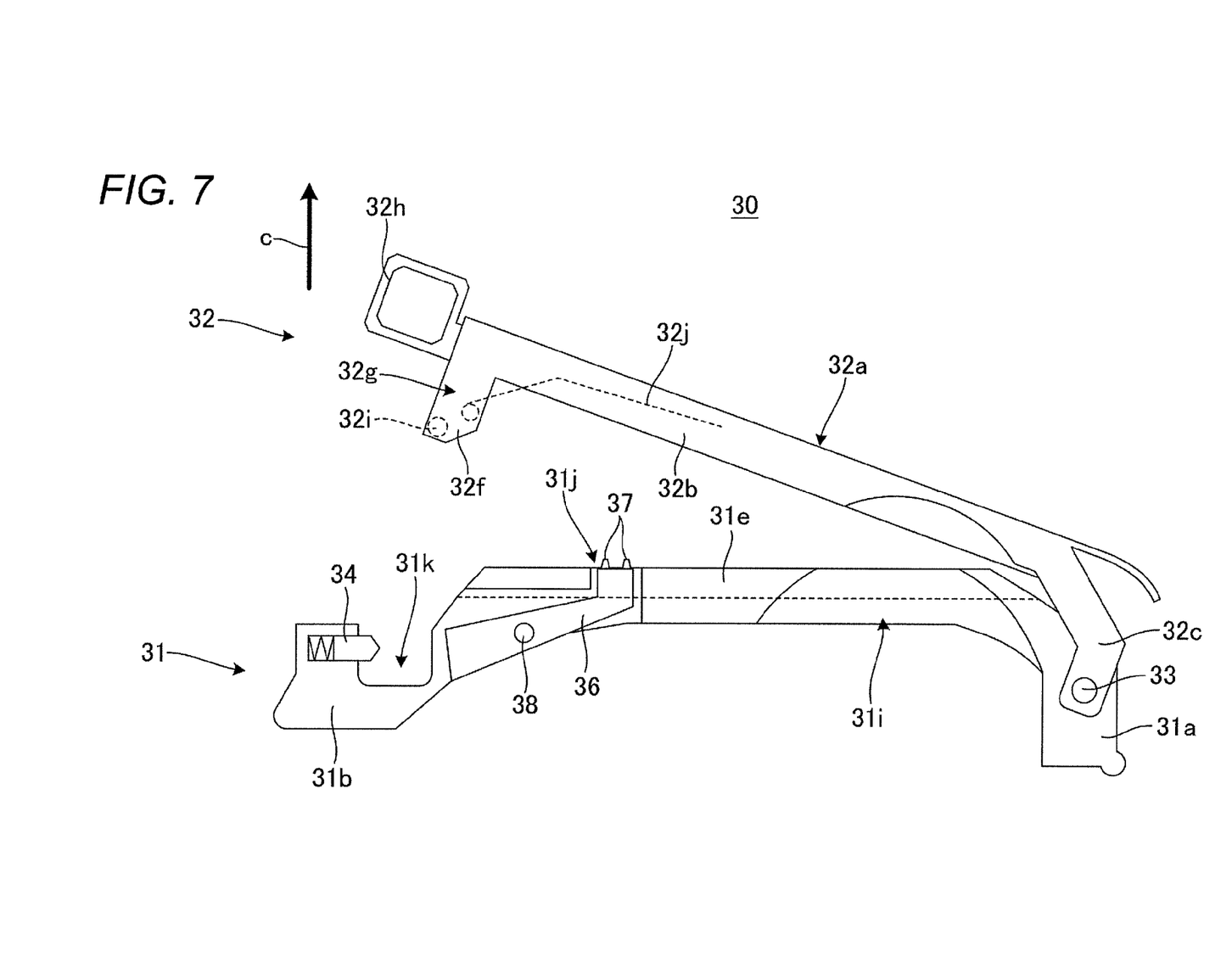
FIG. 7 is an illustrative view illustrating the function of the guide part equipped in the tape feeder according to the embodiment of the present invention.

FIG. 7 illustrates a state in which the grip ring 32h is pulled up (arrow) so that the upper member 32 rotates about the pivotally support pin 33 to open the guide part 30. A new setting of the carrier tape 15 is conducted in this state. In this state, the positioning pins 37 are protruded from the upper surface of the tape support part 31e through the notch part 31j so that the carrier tape 15 can be positioned. The carrier tape 15 guided into the upper member 32 is positioned with respect to the guide part 30 in the tape feed direction by allowing the positioning pins 37 to be fitted into the feed holes 15c by closing the upper member 32.

Figure 8:
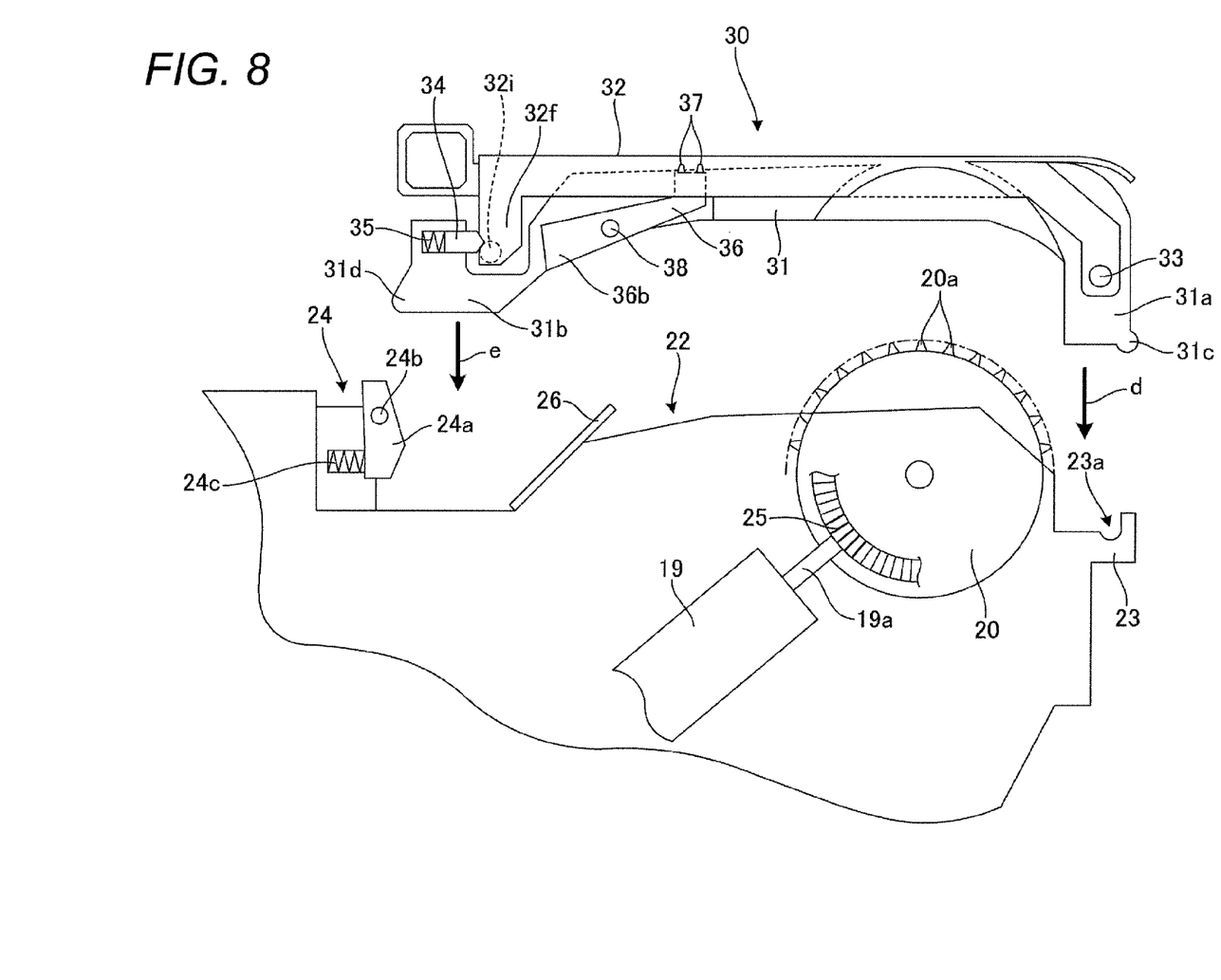
FIG. 8 is an illustrative view illustrating a method of equipping the guide part in the tape feeder according to the embodiment of the present invention.

FIG. 8 illustrates the operation of mounting the guide part 30 in a state where the lower member 31 and the upper member 32 are closed on the guide mounting portion 22 of the main body 5a. In the mounting work, in a state where the downstream mounting part 31a is positioned with respect to the downstream fitting part 23, and the upstream mounting part 31b is positioned with respect to the upstream fitting part 24, the downstream mounting part 31a first comes down (arrow d), the fitting part 31c is fitted into the fitting recess 23a, the upstream mounting part 31b comes down (arrow e), and the engaged part 31d is engaged by the engaging member 24a. In this case, it is desirable that positioning pins for more precisely positioning the positions of the downstream mounting part 31a and the upstream mounting part 31b are disposed in the downstream fitting part 23 and the upstream fitting part 24, and fitted into fitting holes formed in the downstream mounting part 31a and the upstream mounting part 31b, respectively. In this state, the leaf spring member 26 disposed in the guide mounting portion 22 is abutted against the opposite end 36b of the positioning member 36 from the bottom, and an external force for fitting detachment of the positioning pins 37 is exerted on the opposite end 36b. As a result, the positioning pins 37 retreat from the upper surface of the tape support part 31e.

Figure 9A:
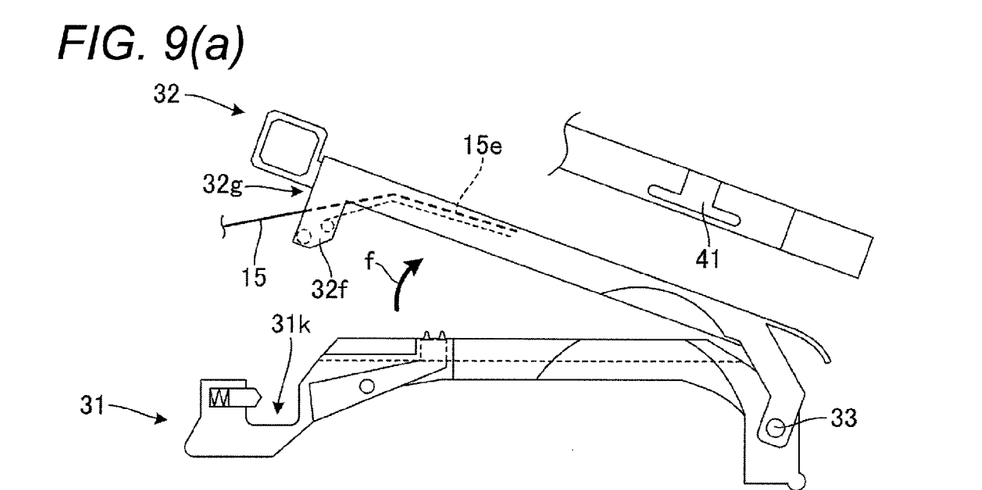
FIGS. 9(a) to 9(c) are illustrative views illustrating a process of a tape mounting method in the tape feeder according to the embodiment of the present invention.

Subsequently, a description will be given of a tape mounting method for mounting a new carrier tape 15 in the tape feeders 5 with reference to FIGS. 9(a) to 9(c), 10(a), and 10(b). First, in a state where the guide part 30 is detached from the main body, the carrier tape 15 is introduced into the upper member 32 from the tape push-in port 32g (tape introducing process). As illustrated in FIG. 9(a), the work is conducted in a state where the bend parts 32f are pulled out of the engagement recess 31k, and the upper member 32 rotates with respect to the lower member 31 (arrow f) to open the guide part 30. In this situation, in a process of inserting the tip 15e of the carrier tape 15 from the tape push-in port 32g, it is visually confirmed through the second opening part 41 as a confirmation opening part formed in the upper surface 32a that the introduced carrier tape 15 arrives at a pin engagement range caused by the sprocket 20 (tape confirming process).

Figure 9B:
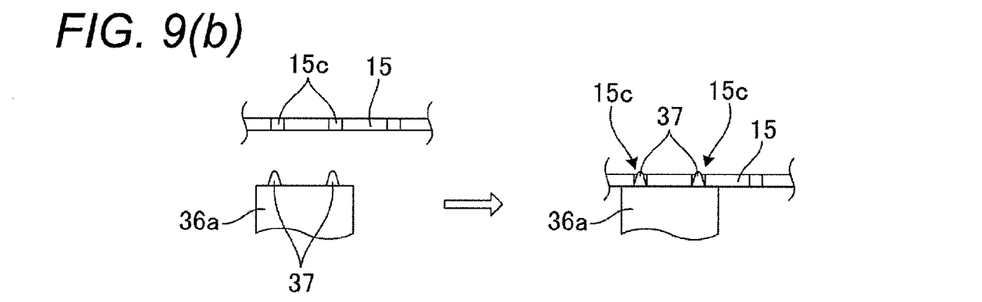
Figure 9C:
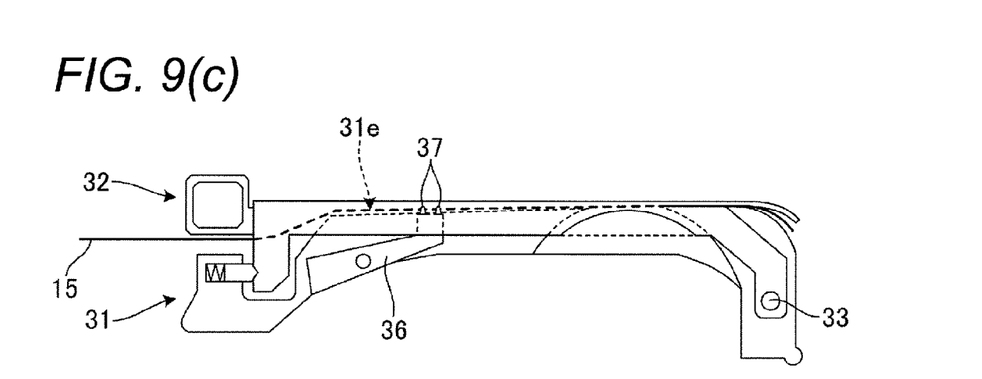

Then, the positioning pins 37 are fitted into the feed holes 15c of the introduced carrier tape 15 to adjust the relative position of the carrier tape 15 and the guide part 30 in the tape feed direction (positioning process). That is, as illustrated in FIG. 9(b), the upper member 32 is closed with respect to the lower member 31 while adjusting the position of the carrier tape 15 so that the positions of the feed holes 15c coincide with the positioning pins 37, to thereby fit the positioning pins 37 into the feed holes 15c. As a result, as illustrated in FIG. 9(c), a new carrier tape 15 is correctly positioned and set in the tape feed direction in the guide part 30 in a state where the lower member 31 and the upper member 32 are integrated together. The mounting of the carrier tape 15 into the main body 5a is conducted in this state.

Figure 10A:
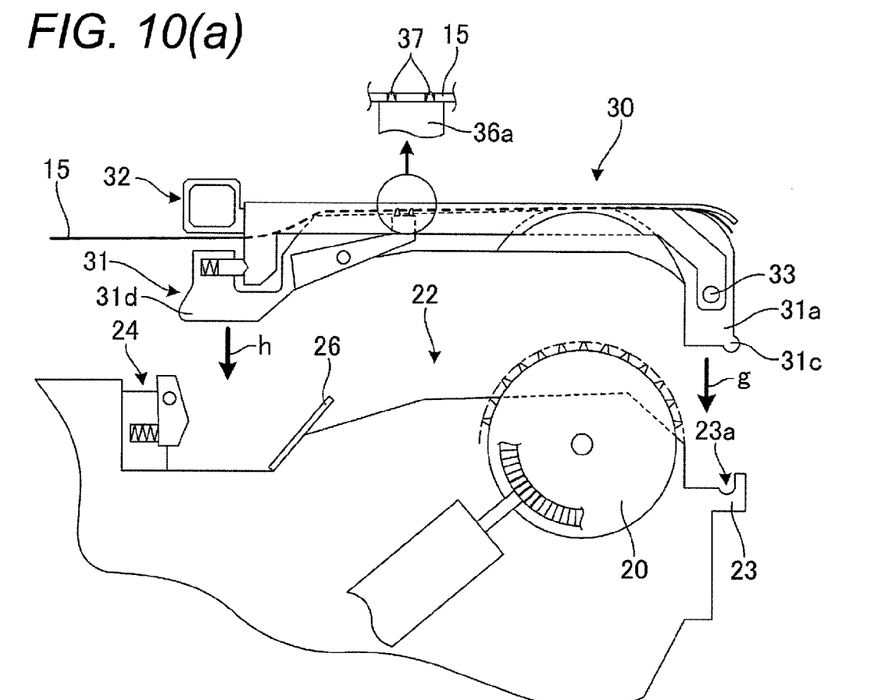
FIGS. 10(a) and 10(b) are illustrative views illustrating the process of the tape mounting method in the tape feeder according to the embodiment of the present invention.
Figure 10B:
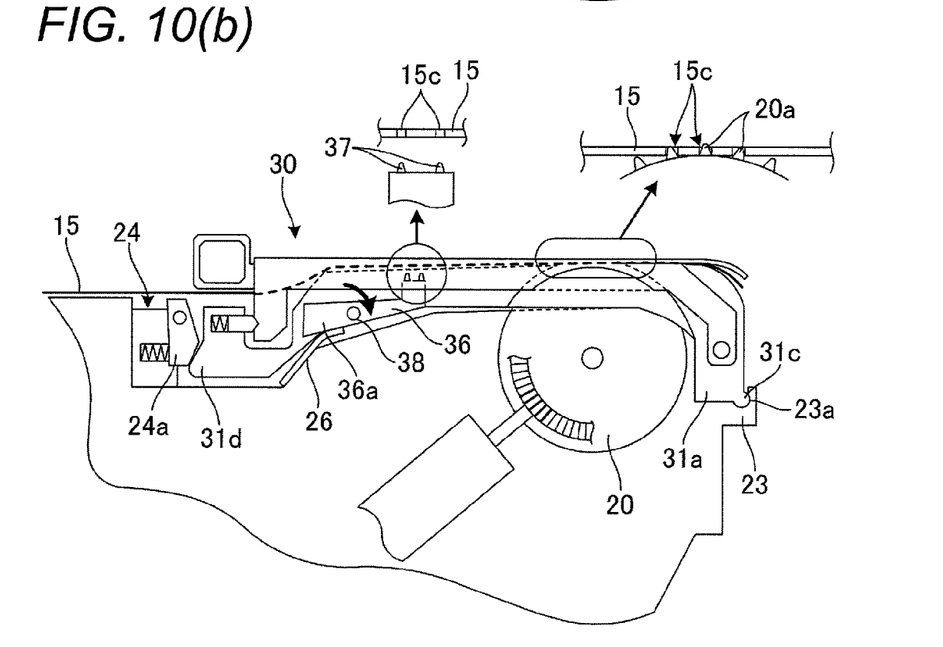

That is, as illustrated in FIG. 10(a), the guide part 30 after the positioning process of setting the carrier tape 15 is positioned and mounted on the guide mounting portion 22 of the main body 5a (guide part fixing process). In the guide part fixing process, as illustrated in FIG. 8, in a state where the downstream mounting part 31a is positioned with respect to the downstream fitting part 23, and the upstream mounting part 31b is positioned with respect to the upstream fitting part 24, the downstream mounting part 31a first comes down (arrow g), and the upstream mounting part 31b then comes down (arrow h). FIG. 10(b) illustrates a state in which the guide part fixing process is completed in this manner. That is, the fitting part 31c is fitted into the fitting recess 23a in the downstream fitting part 23, and the engaged part 31d is engaged with the engaging member 24a in the upstream fitting part 24, to thereby fix the guide part 30 to the guide mounting portion 22. As a result, the leaf spring member 26 is abutted against the pin attachment part 36a so that the positioning pins 37 retreat downward, and is detached from the feed holes 15c of the carrier tape 15 to cancel the positioning, and the carrier tape 15 is fed. At the same time, in the sprocket 20, the feed pins 20a are engaged with the feed holes 15c of the carrier tape 15 to enable the tape feed.

As described above, the tape feeders 5 according to this embodiment includes the guide part 30 that guides the carrier tape 15 fed by the tape feed mechanism in the given range including the pickup position, and is detachably attached to the main body 5a. The guide part 30 includes: the lower member 31 that guides the lower surface side of the carrier tape 15, and includes an attachment/detachment mechanism that is attached to and detached from the main body 5a; the upper member 32 that guides the width direction of the carrier tape 15, and presses down the carrier tape 15 from the upper side to guide the upper surface thereof; the open/close mechanism that opens and closes the upper member 32 with respect to the lower member 31; and the positioning mechanism that fits the positioning pins 37 into the feed holes 15c of the carrier tape 15 in the guide part 30, thereby positioning the relative position of the carrier tape 15 and the guide part 30 in the tape feed direction. This facilitates the positioning in the tape mounting work of mounting a new carrier tape 15 on the tape feeders 5, and enables the workability and the work efficiency to be improved.

Also, in addition to the above configuration, the tape push-in port 32g as the tape introduction part for guiding the carrier tape 15 into the upper member 32 is provided at the upstream side of the upper member 32 in the tape feed direction. As a result, the tape introduction work can be conducted in a state high in the workability where the upper member 32 is opened with respect to the lower member 31. Further, with the provision of the second opening part 41 as a confirmation opening part for visually confirming that the carrier tape 15 introduced into the upper member 32 arrives at the pin engagement range close to the sprocket 20, the tape introduction work can be surely correctly conducted.

The present invention has been described in detail and with reference to the specific embodiments, but it would be obvious to an ordinary skilled person that various modifications and changes may be made to the present invention without departing from the spirit and scope of the present invention.

The present invention is based on Japanese Patent Application No. 2010-231240 filed on Oct. 14, 2010, and content thereof is incorporated herein by reference.

INDUSTRIAL APPLICABILITY

The tape feeder and the tape mounting method in the tape feeder have advantages of facilitating the positioning in the carrier tape mounting work, thereby improving the workability and the work efficiency, and are useful in a component mounting field where the electronic components are extracted from the tape feeder and mounted on the substrate.

DESCRIPTION OF REFERENCE SKINS

1: Component Mounting Device
3: Substrate
4: Component Supply Part
5: Tape Feeder
5a: Main Body
5d: Tape Travel Path
8: Transfer Head
15: Carrier Tape
15a: Component Pocket
15c: Feed Hole
16: Electronic Component
17: Tape Feeder
19: Feed Motor
20: Sprocket
20a: Feed Pin
22: Guide Mounting Portion
23: Downstream Fitting Part
24: Upstream Fitting Part
30: Guide Part
31: Lower Member
31a: Downstream Mounting Part
31b: Upstream Mounting Part
31c: Fitting Part
31d: Engaged Part
31e: Tape Support Part
32: Upper Member
32a: Upper Surface
32b: Side Part
32c: Pivotally Support Plate
32g: Tape Push-In Port
33: Pivotally Support Pin
34: Engagement Member
36: Positioning Member
37: Positioning Pin
38: Pivotally Support Pin
40: First Opening Part
41: Second Opening Part
42: Third Opening Part

The invention claimed is:

1. A tape feeder that feeds a carrier tape holding electronic components pitch by pitch to sequentially feed the electronic components a pickup position of a transfer head, the tape feeder comprising:
  a main body comprising a tape travel path for guiding the carrier tape;
  a tape feed mechanism that intermittently rotates a sprocket in a state in which a feed pin of the sprocket disposed in the main body engages a feed hole disposed in the carrier tape to feed the carrier tape at a given pitch; and
  a guide part that guides the carrier tape fed by the tape feed mechanism in a given range including the pickup position on the main body, and is detachably attached to the main body,
  wherein the guide part comprises:
    a lower member that guides a lower surface side of the carrier tape and comprises an attachment/detachment mechanism that is attached to and detached from the main body;
    an upper member that is provided to include a pin engagement range where the feed pin of the sprocket engages the feed hole, guides a width direction of the carrier tape, and presses down the carrier tape from above to guide an upper surface thereof;

a tape introduction part that is disposed at an upstream side of the upper member in a tape feed direction, and guides the carrier tape into the upper member;

a confirmation opening part disposed in the upper member for visually confirming that the introduced carrier tape arrives at the pin engagement range;

an open/close mechanism that opens and closes the upper member with respect to the lower member; and a positioning mechanism that fits a positioning pin into the feed hole of the carrier tape in the guide part, thereby positioning a relative position of the carrier tape and the guide part in the tape feed direction.

2. The tape feeder according to claim 1,
wherein the open/close mechanism rotates the upper member about a pivotally support point disposed at a downstream side of the lower member in the tape feed direction to open and close the upper member with respect to the lower member.

3. The tape feeder according to claim 1,
wherein the positioning mechanism is configured by disposing the positioning pin in the lower member, and comprises a fitting detaching mechanism that detaches the positioning pin from the feed hole in a state in which the lower member is mounted in the main body.

4. A tape mounting method of mounting a carrier tape into a tape feeder that feeds the carrier tape pitch by pitch to sequentially feed electronic components to a pickup position of a transfer head and comprises: a main body comprising a tape travel path for guiding the carrier tape holding the electronic components; a tape feed mechanism that intermittently rotates a sprocket in a state in which a feed pin of the sprocket disposed in the main body engages a feed hole disposed in the carrier tape to feed the carrier tape at a given pitch; and a guide part that guides the carrier tape fed by the tape feed mechanism in a given range including the pickup position on the main body, and is detachably attached to the main body, wherein the guide part comprises: a lower member that guides a lower surface side of the carrier tape, and includes an attachment/detachment mechanism that is attached to and detached from the main body; an upper member that is provided to include a pin engagement range where the feed pin of the sprocket engages the feed hole, guides a width direction of the carrier tape, and presses down the carrier tape from above to guide an upper surface thereof; a tape introduction part that is disposed at an upstream side of the upper member in a tape feed direction, and guides the carrier tape into the upper member; a confirmation opening part disposed in the upper member for visually confirming that the introduced carrier tape arrives at the pin engagement range; an open/close mechanism that opens and closes the upper member with respect to the lower member; and a positioning mechanism that fits a positioning pin into the feed hole of the carrier tape in the guide part, thereby positioning a relative position of the carrier tape and the guide part in the tape feed direction, said tape mounting method comprising:

introducing the carrier tape into the upper member from the tape introduction part in a state in which the guide part is detached from the main body;

visually confirming that the introduced carrier tape arrives at the pin engagement range;

adjusting the relative position of the carrier tape and the guide part in the tape feed direction by fitting the positioning pin into the feed hole of the introduced carrier tape; and fixedly mounting the guide part on the main body after the relative position is adjusted.

5. The tape mounting method in the tape feeder according to claim 4, wherein the positioning pin is disposed in the lower member, and wherein the positioning pin is detached from the feed hole by mounting the lower member on the main body in when the guide part is mounted on the main body.

* * * * *